US010681781B2

(12) United States Patent
Dughiero et al.

(10) Patent No.: US 10,681,781 B2
(45) Date of Patent: Jun. 9, 2020

(54) APPARATUS AND METHOD FOR DEFROSTING AND/OR COOKING FOODS

(71) Applicant: ILLINOIS TOOL WORKS, INC., Glenview, IL (US)

(72) Inventors: Fabrizio Dughiero, Padua (IT); Marco Bullo, Scorzé (IT); Andrea Baccara, Paris (FR)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

(21) Appl. No.: 15/551,070

(22) PCT Filed: Feb. 12, 2016

(86) PCT No.: PCT/IB2016/050759
§ 371 (c)(1),
(2) Date: Aug. 15, 2017

(87) PCT Pub. No.: WO2016/132260
PCT Pub. Date: Aug. 25, 2016

(65) Prior Publication Data

US 2018/0020510 A1 Jan. 18, 2018

(30) Foreign Application Priority Data

Feb. 17, 2015 (EP) .................................... 15155449

(51) Int. Cl.
*H05B 6/54* (2006.01)
*H05B 6/60* (2006.01)
(Continued)

(52) U.S. Cl.
CPC ........... *H05B 6/1209* (2013.01); *H05B 6/105* (2013.01); *H05B 6/54* (2013.01); *H05B 6/60* (2013.01); *H05B 6/62* (2013.01)

(58) Field of Classification Search
CPC . H05B 6/105; H05B 6/60; H05B 6/54; H05B 6/1209; H05B 6/62
(Continued)

(56) References Cited

U.S. PATENT DOCUMENTS 4,296,298 A 10/1981 MacMaster et al.
4,333,521 A * 6/1982 Stottman .................. H05B 6/62 165/63
(Continued)

FOREIGN PATENT DOCUMENTS

CN 1452852 A 10/2003
CN 101115406 A 1/2008
(Continued)

OTHER PUBLICATIONS

Search Report and Written Opinion of corresponding European application No. 15155449.0 dated Aug. 14, 2015.
(Continued)

*Primary Examiner* — Quang T Van
(74) *Attorney, Agent, or Firm* — Burr & Forman, LLP

(57) ABSTRACT

An apparatus for defrosting or cooking foods, the apparatus including both radio frequency dielectric heating means and an induction heating means. The radio frequency dielectric heating means includes at least two electrodes positioned at a treatment zone, and a device for applying, between the electrodes, a difference in electric potential which is variable with a frequency between 1 MHz and 300 MHz. The induction heating means is electromagnetically coupled to at least one of the electrodes which is at least partly made of ferromagnetic material, such that the electrode transmits heat to the food.

15 Claims, 2 Drawing Sheets

(51) Int. Cl.
*H05B 6/12* (2006.01)
*H05B 6/62* (2006.01)
*H05B 6/10* (2006.01)

(58) Field of Classification Search
USPC ....... 219/771, 601, 725, 777, 780, 778, 684, 219/686, 700, 701; 246/241, 243, 244; 99/451, 358; 422/21, 22, 23
See application file for complete search history.

(56) References Cited

U.S. PATENT DOCUMENTS 6,023,055 A * 2/2000 Yamamoto ................ A23L 3/01 219/771
2005/0104532 A1* 5/2005 Okumura .................. H01J 9/50 315/169.4
2008/0105672 A1* 5/2008 Yamamoto ............... A23B 4/07 219/703
2010/0115785 A1* 5/2010 Ben-Shmuel ......... D06F 58/266 34/260
2011/0177666 A1* 7/2011 Nozawa ................ H01L 27/101 438/382

FOREIGN PATENT DOCUMENTS

JP S56154981 A 11/1981
JP 60001785 B * 1/1985 ............... H05B 6/12

OTHER PUBLICATIONS

International Search Report and Written Opinion of PCT/IB2016/050759 dated May 12, 2016.
Chapter I International Preliminary Report of Patentability of PCT/IB2016/050759 dated Aug. 22, 2017.
First Office Action issued in corresponding Chinese Application No. 201680021496.8 dated Apr. 3, 2020, all enclosed pages cited.

* cited by examiner

APPARATUS AND METHOD FOR DEFROSTING AND/OR COOKING FOODS

CROSS-REFERENCE TO RELATED APPLICATIONS

This application is an international application which claims priority to EP application number 15155449.0 filed Feb. 17, 2015, all of which is incorporated herein in its entirety.

DESCRIPTION

This invention relates to an apparatus and a method for defrosting and/or cooking foods. Advantageously, this invention may be applied for a combined treatment which, starting with a frozen food, comprises first a defrosting step and, then and without interruption, a cooking step. In particular, this invention was created with reference to uses in restaurants or other refreshment premises for preparing meals starting with frozen products. Despite that, it could also advantageously be used at industrial level.

As is known, at present there are many known and widely-used techniques for heating food, both for defrosting and for cooking. Amongst these, it is possible to distinguish between a first family in which heat enters the food through its outer surface and in which the flow of heat inside is determined by the temperature gradient and by thermal diffusivity, and a second family in which heat is in contrast generated directly inside the food. The first family includes the techniques of heating with hot air, steam, electrical heating using resistance or heating elements, infra-red heating, etc. The second family in contrast includes the techniques of heating using electromagnetic fields, such as radio frequency (RF) dielectric heating and heating with microwaves (MW). In the known way, radio frequency (RF) electromagnetic waves lie within the band of frequencies between 1 and 300 MHz, whilst microwaves (MW) lie within the band between 300 MHz and 300 GHz.

Each of the known heating techniques has distinctive features well-known in the sector, which may constitute either specific advantages or specific limits. For example, the heating techniques of the second family guarantee cooking times that are considerably shorter than those of the techniques of the first family, but are not usually suitable for cooking when the outside of the food needs to be made crispy (for example, when cooking frozen pizzas, where it would be appropriate to make the base of the pizza at least a little crispy).

A problem common to all of the prior techniques, which however is manifested in different ways depending on the technique used, is that of the distribution of the temperature in the food. In fact, on one hand techniques in which heating occurs from the outside struggle to heat the centre of the food. On the other hand, techniques comprising the generation of heat inside the food are negatively affected by heat losses from the surface of the food, the losses being at surface level due to the relatively cold environment which usually surrounds it.

Consequently, over the years many combined heating systems have been developed, using simultaneously or in rapid succession a plurality of different heating techniques, both from the same family, and above all from different families.

Although the culinary results that can be obtained with the prior art combined systems are already very satisfactory, the Applicant believes that the combined systems developed up to now have limits both regarding energy efficiency and regarding the ease with which the cooking process is controlled, at least with foods having a certain uniformity (for example pizzas, baked lasagne, "panini" sandwiches or rolls, hamburgers, etc.).

In this context, the technical purpose which forms the basis of this invention is to provide an apparatus and a method for defrosting and/or cooking foods which uses a combined heating system and which overcomes the above-mentioned disadvantages.

In particular it is the technical purpose of this invention to provide an apparatus and a method for defrosting and/or cooking foods based on a combined system in which different heating techniques can be adjusted independently.

Furthermore, it is the technical purpose of this invention to provide an apparatus and a method for continuously defrosting and cooking frozen foods.

The technical purpose specified and the aims indicated are substantially achieved by an apparatus and a method for defrosting and/or cooking foods as described in the appended claims.

In particular, many tests carried out by the Applicant allowed the Applicant to understand that optimum results in terms of defrosting and/or cooking can be achieved using radio frequency dielectric heating.

This is the heating technique which has so far been the least widespread, both on its own and in combined systems. The reasons for this limited spread are not unanimously recognised. On one hand it is a technique which, after good development in the mid-twentieth century, was put aside in favour of microwave heating which, from the 1970s, gradually became increasingly popular partly thanks to the creation of domestic microwave ovens. On the other hand, it is a technique which is commonly always associated with having to insert the food to be heated between two flat electrodes extending relatively far compared with the food and advantageously close to the food. These geometric/structural constraints were probably an obstacle to the combination of radio frequency dielectric heating with other types of heating, in particular of the first family described above.

As already indicated, despite this limited attention of the sector to radio frequency dielectric heating, thanks to specific tests carried out, the Applicant realised that radio frequency dielectric heating would, in contrast, be a very advantageous technique for obtaining particularly uniform heat distributions inside food (much more uniform than those obtainable with microwaves thanks to the considerably higher wavelengths), as well as with a reduced risk of formation of so-called "hot spot" which in contrast are typical in microwave ovens.

Further features and the advantages of this invention are more apparent in the detailed description, with reference to the accompanying drawings which illustrate several preferred, non-limiting embodiments of an apparatus and a method for defrosting and/or cooking foods, in which.

Figure 1:
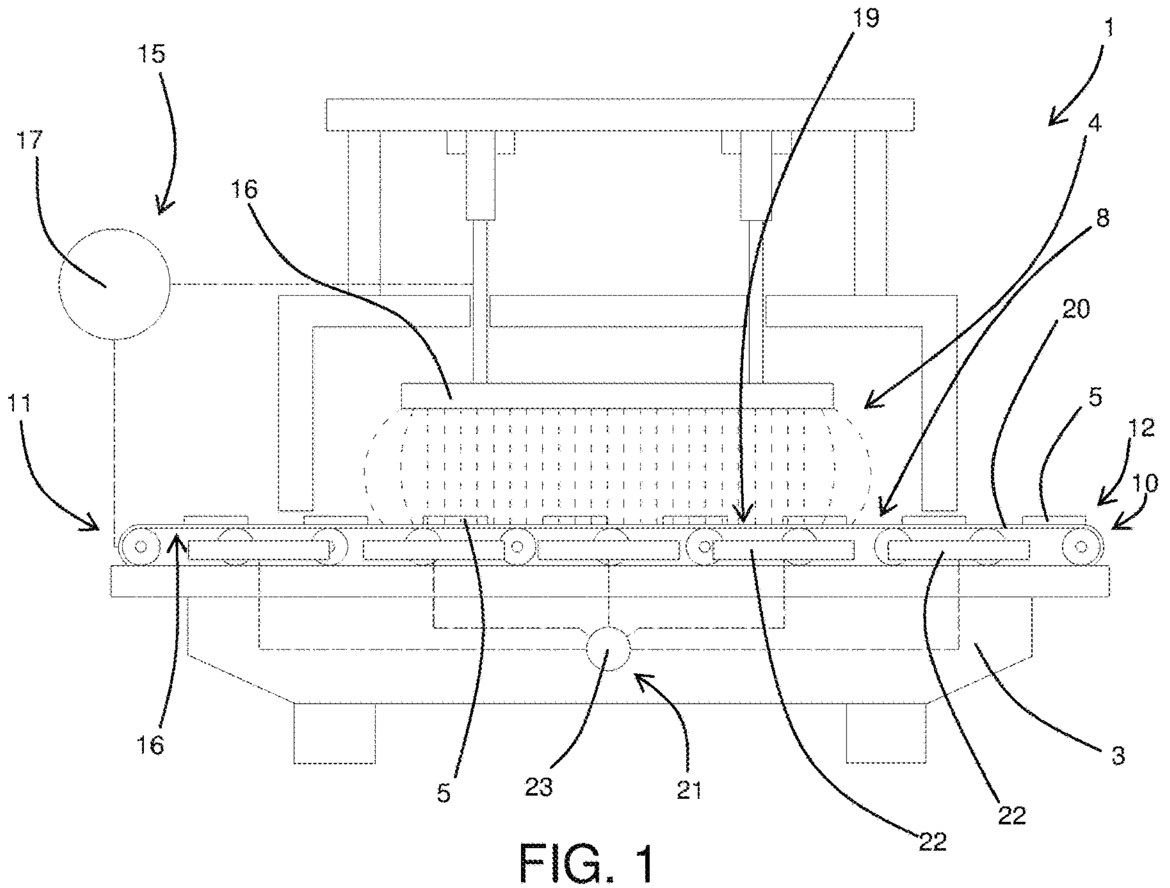
FIG. 1 is a schematic side view of a first apparatus of the continuous type made in accordance with this invention, in a first operating configuration.

With reference to the accompanying drawings the numeral 1 denotes in its entirety an apparatus for defrosting and/or cooking foods according to this invention.

Therefore, hereinafter first the apparatus 1 is described, and then the method according to this invention.

In general, the apparatus 1 may be of either the continuous type (the foods are defrosted and/or cooked as they are fed along a predetermined path, usually inside a tunnel), or of the static type (during heating the foods remain stationary inside a chamber 2 which is advantageously openable and closable).

The apparatus 1 comprises a supporting structure 3 on which a treatment zone 4 is identified which is the zone where the food 5 is heated. In the case of static apparatuses the treatment zone 4 corresponds with the space inside the chamber 2 (defined between a base 6 and an openable lid 7 in the accompanying drawings). In the case of apparatuses of the continuous type the treatment zone 4 corresponds to the part of the food 5 feed path where the heating systems described below are positioned.

Figure 2:
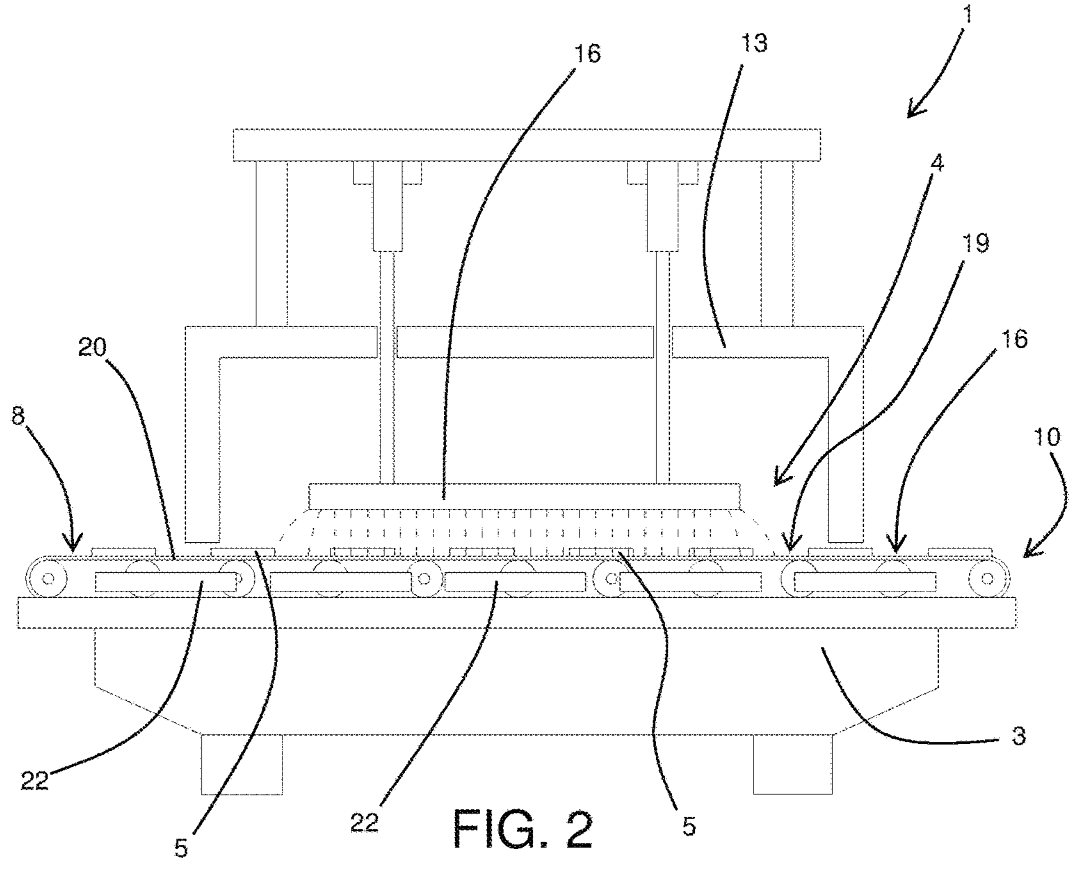
FIG. 2 shows the apparatus of FIG. 1 in a second operating configuration.
Figure 3:
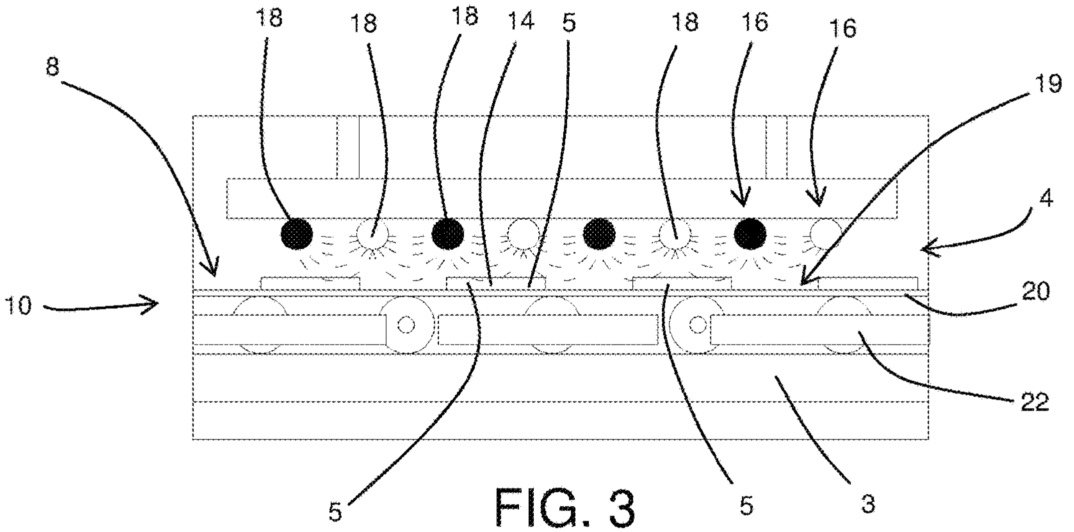
FIG. 3 illustrates a detail of a second apparatus of the continuous type made in accordance with this invention, in a second operating configuration similar to that of FIG. 2.
Figure 4:
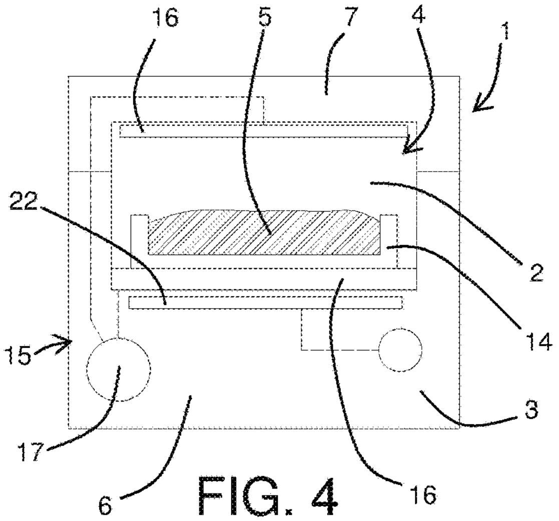
FIG. 4 is a schematic lateral cross-section of a first apparatus of the static type made in accordance with this invention.
Figure 5:
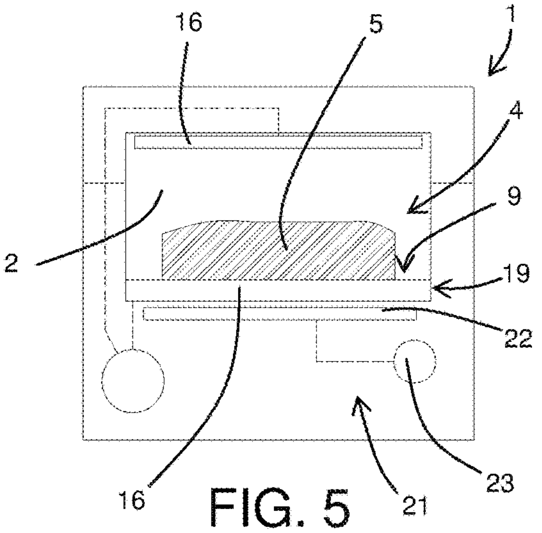
FIG. 5 is a schematic lateral cross-section of a second apparatus of the static type made in accordance with this invention.
Figure 6:
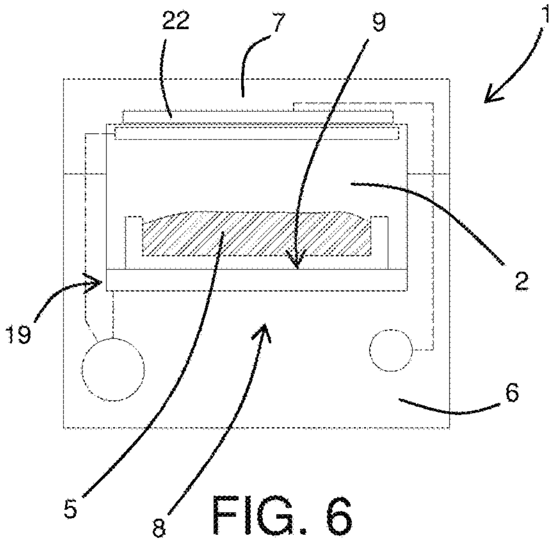
FIG. 6 is a schematic lateral cross-section of a third apparatus of the static type made in accordance with this invention.

At the treatment zone 4, mounted on the supporting structure 3 there are supporting means 8 for at least one food 5 to be cooked. In particular, depending if the apparatus 1 is of the continuous type or the static type, the supporting means 8 may comprise either a simple resting surface 9 (FIGS. 4 to 7) or a belt conveyor 10 extending from a first, loading end 11 to a second, unloading end 12 and passing through the treatment zone 4 (FIGS. 1 to 3). Advantageously, the treatment zone 4 is enclosed by a containment element 13 mounted on the supporting structure 3 and provided with at least two opposite openings for allowing the infeed and outfeed of the belt conveyor 10.

Advantageously, the apparatus 1 may also comprise one or more pans 14 for supporting or containing the food 5 to be treated, designed in use to be rested on the supporting means 8.

Also at the treatment zone 4, the apparatus 1 comprises radio frequency dielectric heating means 15. In accordance with normal technical language, that definition refers to dielectric heating means which use variable electromagnetic fields with frequencies of between 1 MHz and 300 MHz.

The radio frequency dielectric heating means 15 in turn comprise at least two electrodes 16 positioned at the treatment zone 4, and a device 17 for applying between the two electrodes 16 a variable difference in electric potential which is variable with a frequency of between 1 MHz and 300 MHz, for in use generating between the electrodes 16 a variable electromagnetic field with that frequency. However, in the preferred embodiments, the device 17 for applying the variable difference in electric potential applies a difference in electric potential which is variable with a frequency within the range of between 10 MHz and 100 MHz, and even more preferably with a frequency corresponding to one of those currently freely available for industrial applications, equal to 13.56, 27.12 or 40.68 MHz.

In the preferred embodiments, application of the variable difference in electric potential between the electrodes 16 is performed by keeping one of the two electrodes 16 at the earth potential, and varying the potential of the other. The choice of the electrode 16 to be kept at the earth potential may depend either on safety requirements of the apparatus 1 or on other requirements linked to other aspects of this invention which are described below.

As regards the intensity of the electromagnetic field, the corresponding electric field per unit of length is preferably within the range between 50 V/cm and 5 kV/cm. Preferably, however, the intensity of the electric field per unit of length in the food is within the range 50V/cm and 200 V/cm.

It is to be noted that the intensity of the electric field per unit of length depends on the permittivity of the medium in which the field exists, so that a great difference can exist between the food 5 (which generally has a relative permittivity in the range 40-50) and the air surrounding the food 5 (which has a relative permittivity of 1). Consequently, to obtain the same intensity in a food 5, if the air gap between the electrodes 16 and the food 5 is large, a relatively high voltage has to be applied between the electrodes 16, while the if the air gap between the electrodes 16 and the food 5 is small, a relatively low voltage can be applied between the electrodes 16. As a consequence, if the food 5 has a regular shape (e.g. is a parallelepiped), electrodes can be placed very near to the food 5 and a relatively low voltage is sufficient, while, if the food 5 has a highly irregular shape, the air gap must be kept relative large to avoid the occurrence of hot spots or discharges but, as a consequence, a relatively high voltage has to be used.

Figure 7:
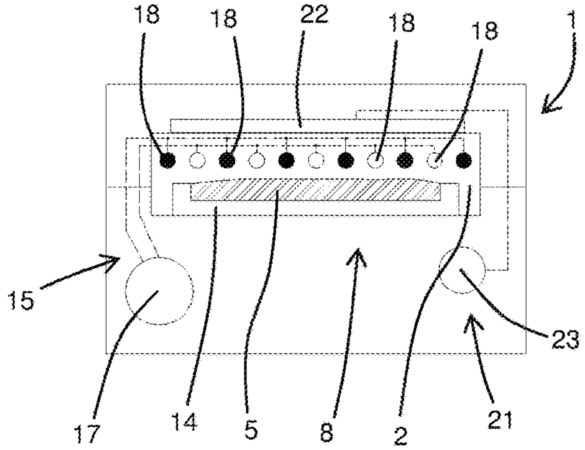
FIG. 7 is a schematic lateral cross-section of a fourth apparatus of the static type made in accordance with this invention.

In terms of the arrangement of the electrodes 16 relative to the food 5, and consequently the trend of the electromagnetic field, there are various possibilities depending on the desired trend of the electromagnetic field. However, there are two preferred arrangements. A first arrangement in which the two electrodes 16 are positioned on two opposite sides of the treatment zone 4 and of the food 5 to be heated (FIGS. 1 and 2, 4 to 6), and a second arrangement in which the two electrodes are positioned on the same side of the treatment zone 4 and of the food 5 (FIGS. 3 and 7).

In the former case, at least at the treatment zone 4 the electrodes 16 advantageously extend mainly flat, preferably in such a way that they cover the entire treatment zone 4, and in any case in such a way that they delimit a space sufficiently larger than that in which the food 5 is located to guarantee that the electromagnetic field in the food 5 is substantially constant (in the case of an apparatus of the continuous type, at least when the food is at the centre of the electrodes.

In contrast, in the latter case the two electrodes 16 each comprise a plurality of equipotential elements 18, the equipotential elements 18 of the two electrodes being arranged in an alternating fashion along one or more directions (in the accompanying drawings the equipotential elements 18 of one of the electrodes are shown as black dots, whilst those of the other electrode are shown as white dots). In simplest case illustrated in FIGS. 3 and 7, each equipotential element 18 has the shape of a bar which, in the case of apparatuses of the continuous type, advantageously extends transversally to the direction of feed of the belt conveyor 10, and the equipotential elements 18 alternate along the direction of feed of the food 5. In more complex embodiments, the equipotential elements 18 may even not extend in an elongate fashion (for example, they may be half-spheres) and in contrast they may be staggered.

In the accompanying drawings from 1 to 3, the lines of extension of the electromagnetic field in both of the cases described above are shown as dashed lines.

Since, as shown in FIG. 3, if the electrodes 16 are constituted of alternating equipotential elements 18, the electromagnetic field extends mainly in a plane corresponding to the plane in which the electrodes 16 lie, this embodiment is advantageous for the treatment of foods which have a reduced extent in a direction exiting the main plane of extension of the electromagnetic field (a reduced thickness in the embodiments illustrated in which the electrodes 16 are positioned above the food 5).

In some embodiments, it may also be the case that at least one of the electrodes 16 also constitutes at least a part of the supporting means 8, as in the case of the embodiments of FIGS. 1 and 2 and 4 to 6. For example, whilst in the case of the embodiments of FIGS. 4 to 6 one of the electrodes 16 defines the resting surface 9 for the food 5, in the case of the embodiment in FIGS. 1 and 2, the belt conveyor 10 comprises at least one active portion 19 which is electrically conductive and which constitutes at least a part of one of the electrodes 16. Advantageously, said active portion 19 is constituted of the entire belt 20 of the belt conveyor 10, which for that purpose will be made of an electrically conductive material (in contrast, in applications with the electrodes 16 positioned on the same side of the food 5, the belt 20 will advantageously be made of electrically insulating material).

In the embodiments comprising the presence of one or more pans 14, advantageously each pan 14 may also be at least partly made of electrically conductive material and it too may also constitute at least a part of one of the electrodes 16. In this case, preferably the electric connection of the pan 14 to the device 17 for applying the variable difference in electric potential is made either simply by resting on one or more conductive elements which are also part of the related electrode 16, or by means of suitable electric contracts (for example, in the case of an apparatus 1 of the continuous type, sliding contacts can be used).

Advantageously, in the case of embodiments with the use of a belt conveyor 10 comprising an active portion 19 which is a part of one of the electrodes 16, at least at the treatment zone 4 the part made of electrically conductive material of each pan 14 is electrically connected to the active portion 19 so that it substantially has the same electric potential as it. Advantageously, that is achieved by simple contact (the pan 14 rests on the active part of the belt conveyor 10, that is to say, on the belt 20 in the accompanying drawings).

According to a further aspect of this invention, it is possible to vary the distance both between the electrodes 16, and between one or more of the electrodes 16 and the food 5.

That can be done in various ways.

Adjustment of the distance between the electrodes 16 can be obtained thanks to the fact that at least one of the electrodes 16 can be made movable relative to the other.

The variation in the distance from the food 5 may, in contrast, be achieved by making at least one of the electrodes 16 movable relative to the supporting means 8, and/or by making the supporting means 8 movable relative to at least one of the electrodes 16. Obviously, if the supporting means 8 coincide with one of the electrodes 16, there may be relative mobility only between the supporting means 8 and the other electrode 16.

In the case of the embodiment of FIG. 1, the electrode 16 positioned above the food 5 is movable both relative to the other electrode 16 and relative to the belt conveyor 10. In contrast, in the case of the embodiment of FIG. 3, the two electrodes 16 are movable together relative to the belt conveyor 10.

In accordance with a fundamental innovative aspect of this invention, at least one of the electrodes 16 is at least partly made of ferromagnetic material, and the apparatus 1 comprises induction heating means 21, electromagnetically coupled to said electrode 16. During use of the apparatus 1, the induction heating means 21 are designed to heat each electrode 16 to which they are coupled to a temperature such that the electrode 16 can transmit to the food 5 a quantity of heat sufficient to significantly contribute to the defrosting and/or cooking process. In general, the induction heating means comprise one or more inductors 22 coupled to the related electrode 16, and means 23 for applying an alternating voltage to the ends of each inductor 22.

For example, the induction heating means 21 may be sized/structured in such a way as to bring the surface temperature of the electrode 16 with which they are associated, to a temperature in the range between 50° C. and 250° C. depending on the kind of heating desired (defrosting or cooking).

Advantageously, tests and simulations performed showed how it is possible to obtain excellent results by using, for the induction heating, frequencies of between 20 kHz and 800 kHz and a ratio between power (measured in W) and the volume of electrode 16 to heat (measured in $cm^3$) comprised in the range between 50 and 200.

In the embodiments in which the pan 14 or the pans 14 are a part of one of the electrodes 16, advantageously the induction heating means 21 are electromagnetically coupled to the pan 14 (or to two or more pans 14 simultaneously). For that purpose each pan 14 preferably comprises a core made of ferromagnetic material, the outside of which is coated with food-safe stainless steel. The rest of the corresponding electrode 16 will, in contrast, advantageously be made of a non-ferromagnetic conductive material such as copper or aluminium.

In the case of the embodiments of FIGS. 3 and 7, the induction heating means 21 may be coupled to some or all of the equipotential elements 18 of only one of the electrodes 16 or of both of the electrodes 16. Consequently, the equipotential elements 18 with which the induction heating means 21 are electromagnetically coupled will comprise at least one part (for example a core) made of ferromagnetic material.

To simplify both the production and operation of the apparatus 1, advantageously the induction heating means 21 may be electromagnetically coupled to the electrode 16 which in use is kept at the earth potential. Finally, it should be noticed that the apparatus 1 may also comprise several radio frequency dielectric heating means 15, just as the radio frequency dielectric heating means 15 present may comprise several pairs of electrodes 16 which are powered jointly or separately.

Operation of the apparatus 1 made according to this invention derives immediately from the description of the structure above. Moreover, it also represents one of the possible ways of implementing the method for defrosting and/or cooking foods which also forms the subject matter of this invention, which will be described below. However, it should be noticed that what is described respectively with reference to the apparatus 1 or to the method, shall also be considered valid respectively for the method or the apparatus 1 provided that it is applicable.

The method according to this invention comprises in general heating the food 5 to be defrosted and/or cooked, substantially simultaneously either with a radio frequency dielectric heating system or by means of hot elements (which depending on the positioning can transfer heat to the food 5 either by radiation/convection, or by conduction) with the particular feature of using the same parts as both electrodes 16 for the dielectric heating, and as hot elements. More precisely, the method comprises a first step in which, at a treatment zone 4, a food 5 is subjected to radio frequency dielectric heating with a frequency of between 1 MHz and 300 MHz. Advantageously, that is achieved by applying a variable difference in electric potential between two electrodes 16 positioned close to the food, and preferably using an electromagnetic field for which the intensity of the electric field per unit of length in the food is within the range 50V/cm and 200 V/cm.

The method then comprises, during the dielectric heating, subjecting at least one of the two electrodes 16 to electromagnetic induction heating, in such a way that the electrode 16 transmits heat to the food 5 from the outside of the food 5. For that purpose, as seen, the electrode 16 heated by induction must be at least partly made of ferromagnetic material.

In a preferred embodiment of this invention, a pan 14 for supporting the food 5 is used at least as part of the electrode 16 heated by induction. In this way, at least the lower part of the food 5 is directly in contact with the electrode 16 heated by induction.

Depending on the different embodiments, either the food 5 may remain stationary during the entire treatment, or it may be fed along a feed path extending through the treatment zone 4.

This invention brings important advantages.

First, this invention allowed the definition of a heating system which guarantees a high level of energy efficiency thanks to the fact that the radio frequency dielectric heating allows the food to be heated in quite a uniform way, and thanks to the fact that the induction heating of the electrodes allows, with a high level of efficiency, the emission of the heat transferred to the food from the outside to be located extremely close to the food.

Second, this invention allowed the definition of a heating system which guarantees that the cooking process is very easy to control. In fact, the two heating techniques used can be freely adjusted completely independently based on the desired result and they allow almost instantaneous variation of the amount of heat generated both in the food and in the electrodes. Finally, as seen, thanks to this invention continuous defrosting and cooking of frozen foods is particularly advantageous.

Finally, it should be noticed that this invention is relatively easy to produce and that even the cost linked to implementing the invention is not very high.

The invention described above may be modified and adapted in several ways without thereby departing from the scope of the inventive concept.

Moreover, all details of the invention may be substituted with other technically equivalent elements and the materials used, as well as the shapes and dimensions of the various components, may vary according to requirements.

The invention claimed is:

1. An apparatus for defrosting or cooking foods, comprising:

a supporting structure;

a treatment zone;

supporting means for at least one food to be defrosted or cooked at the treatment zone and being mounted on the supporting structure, the supporting means comprising a pan;

radio frequency dielectric heating means mounted on the supporting structure at the treatment zone and configured to transmit energy in order to defrost or cook the at least one food, the radio frequency dielectric heating means comprising at least two electrodes positioned at the treatment zone and a device for applying, between the at least two electrodes, a difference in electric potential which is variable with a frequency between 1 MHz and 300 MHz during an application of the energy to the at least one food; and an induction heating means electromagnetically coupled to one electrode of the at least two electrodes such that the one electrode transmits heat to the at least one food, wherein the at least two electrodes are positioned above and spaced apart from the at least one food, wherein either of the at least two electrodes are movable relative to the other, and wherein the pan forms a first portion of the one of the at least two electrodes and comprises a core formed of ferromagnetic material, and wherein a second portion of the one of the at least two electrodes is formed of non-ferromagnetic conductive material.

2. The apparatus according to claim 1, wherein the supporting means further comprises a belt conveyor extending from a first, loading end to a second, unloading end and passing through the treatment zone.

3. The apparatus according to claim 1, wherein each electrode of the at least two electrodes comprises a plurality of equipotential elements, the equipotential elements of one electrode of the at least two electrodes alternating with those of another electrode of the at least two electrodes.

4. The apparatus according to claim 1, wherein the device for applying between the at least two electrodes a variable difference in electric potential applies a difference in electric potential which is variable with a frequency of between 10 MHz and 100 MHz.

5. The apparatus according to claim 1, wherein the induction heating means operates at a frequency of between 50 kHz and 800 kHz.

6. The apparatus according to claim 1, wherein the device is configured to hold one of the at least two electrodes at an earth potential while varying a potential of another of the at least two electrodes in order to apply, between the at least two electrodes, the difference in electric potential which is variable with the frequency of between 1 MHz and 300 MHz.

7. The apparatus according to claim 1, wherein the supporting means further comprises a belt conveyor, and wherein each of the at least two electrodes extends transversally to a direction of the belt conveyor.

8. The apparatus according to claim 1, wherein the supporting means further comprises a belt conveyor, the belt conveyor being formed of electrically insulating material.

9. A method for defrosting or cooking foods comprising the operating steps of:

positioning a food on a supporting means in a treatment zone of an apparatus, the supporting means comprising a pan;

applying a variable difference in electric potential, which is variable with a frequency between 1 MHz and 300 MHz, between at least two electrodes of a radio frequency dielectric heating means, during an application of energy to the food in the treatment zone, wherein the at least two electrodes are positioned above and spaced apart from the food, and wherein the pan forms a first portion of one of the at least two electrodes and comprises a core formed of ferromagnetic material, and wherein a second portion of the one of the at least two electrodes is formed of non-ferromagnetic conductive material; and subjecting, during the application of the variable difference in electric potential, the one of the at least two electrodes to induction heating, in such a way that the one of the at least two electrodes transmits the energy to the food from an outside of the food.

10. The method according to claim 9, wherein, during the application of the variable difference in electric potential, the food is fed along a feed path extending through the treatment zone.

11. The method according to claim 9, wherein the application of the variable difference in electric potential comprises holding one of the at least two electrodes at an earth potential while varying a potential of another of the at least two electrodes in order to apply, between the at least two electrodes, the difference in electric potential which is variable with the frequency of between 1 MHz and 300 MHz.

12. An apparatus for defrosting or cooking foods, the apparatus comprising:

a supporting structure;

a treatment zone;

supporting means for at least one food to be defrosted or cooked at the treatment zone and being mounted on the supporting structure;

radio frequency dielectric heating means mounted on the supporting structure at the treatment zone and configured to transmit energy in order to defrost or cook the at least one food, the radio frequency dielectric heating means comprising a first electrode and a second electrode positioned at the treatment zone and a device for applying, between the first electrode and the second electrode, a difference in electric potential which is variable with a frequency between 1 MHz and 300 MHz during an application of the energy to the at least one food, wherein the first electrode comprises a first portion and a second portion, an induction heating means electromagnetically coupled to the first electrode such that the first electrode transmits heat to the at least one food, wherein the supporting means comprises a pan, wherein the pan forms a first portion of the first electrode and comprises a core formed of ferromagnetic material, and wherein a second portion of the first electrode is formed of non-ferromagnetic conductive material.

13. The apparatus according to claim 12, wherein at least one of the first or second electrodes is movable relative to the other.

14. The apparatus according to claim 12, wherein the first electrode and the second electrode are positioned on two opposite sides of the treatment zone.

15. The apparatus according to claim 12, wherein the first electrode and the second electrode are positioned on the same side of the treatment zone.

* * * * *